united States Patent [19]

(12) United States Patent
Noda et al.

(10) Patent No.: US 7,501,588 B2
(45) Date of Patent: Mar. 10, 2009

(54) MAGNETIC SHIELDING DOOR AND MAGNETIC SHIELDING ROOM

(75) Inventors: Hideki Noda, Kobe (JP); Masao Murakami, Kobe (JP); Koji Uno, Kobe (JP); Kentaro Matsushita, Kobe (JP); Takubi Hamano, Tokyo (JP); Takeshi Saito, Tokyo (JP); Yasushi Sato, Tokyo (JP)

(73) Assignees: Nabtesco Corporation (JP); Kajima Corporation (JP)

( * ) Notice: Subject to any disclaimer, the term of this patent is extended or adjusted under 35 U.S.C. 154(b) by 0 days.

(21) Appl. No.: 11/667,868

(22) PCT Filed: Oct. 18, 2005

(86) PCT No.: PCT/JP2005/019128

§ 371 (c)(1),
(2), (4) Date: May 15, 2007

(87) PCT Pub. No.: WO2006/054414

PCT Pub. Date: May 26, 2006

(65) Prior Publication Data

US 2008/0006443 A1 Jan. 10, 2008

(30) Foreign Application Priority Data

Nov. 16, 2004 (JP) ............................. 2004-332380

(51) Int. Cl.
*H05K 9/00* (2006.01)
(52) U.S. Cl. .................. 174/382; 174/384; 174/391
(58) Field of Classification Search ............... 174/350, 174/377, 384, 382, 391; 49/501, 480.1; 361/816, 361/818
See application file for complete search history.

(56) References Cited

U.S. PATENT DOCUMENTS

| 5,452,550 | A  | * | 9/1995  | Vanesky et al. ............. 52/173.1 |
| 5,736,671 | A  | * | 4/1998  | Perala et al. ................. 174/365 |
| 5,786,547 | A  | * | 7/1998  | Zielinski ..................... 174/375 |
| 6,170,203 | B1 | * | 1/2001  | Schlapfer .................... 52/173.1 |
| 6,303,854 | B1 | * | 10/2001 | Papaleo et al. ............... 174/382 |
| 6,426,458 | B1 | * | 7/2002  | Hinzpeter et al. ............ 174/375 |
| 6,519,899 | B1 | * | 2/2003  | Hurzeler ...................... 49/501  |
| 6,914,184 | B1 | * | 7/2005  | Lahita ......................... 174/374 |
| 6,992,246 | B2 | * | 1/2006  | Christou ..................... 174/374 |

FOREIGN PATENT DOCUMENTS

| JP | 5-287962   | 11/1993 |
| JP | 2002-164686 | 6/2002  |

* cited by examiner

*Primary Examiner*—Hung V Ngo
(74) *Attorney, Agent, or Firm*—Gerald E. Hespos; Anthony J. Casella

(57) ABSTRACT

A magnetic shielding door (10) opens and closes a gate (16) of a magnetic shielding room. Magnetic members (15) made of a magnetic material are aligned at intervals on walls of the magnetic shielding room. Magnetic shielding forming members (27) are disposed to correspond to the respective magnetic members (15) and are made of a magnetic body that forms a magnetic shielding in corporation with the magnetic members (15). A movable mechanism (28) moves the magnetic shielding forming members (27) at the door closing position at which the gate (16) is closed. The movable mechanism (28) moves the magnetic shielding forming members (27) between a join position at which the magnetic members (15) and the corresponding magnetic shielding forming members (27) are joined to each other and a spaced-apart position at which the magnetic members (15) and the corresponding magnetic shielding forming members (27) are spaced apart.

20 Claims, 13 Drawing Sheets

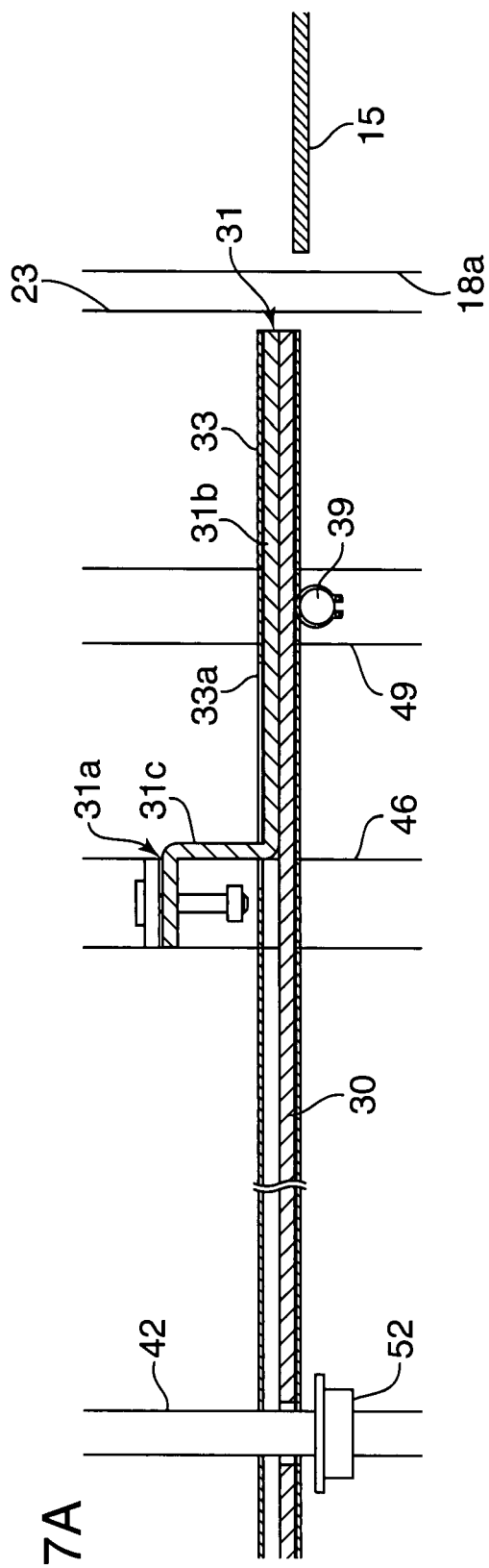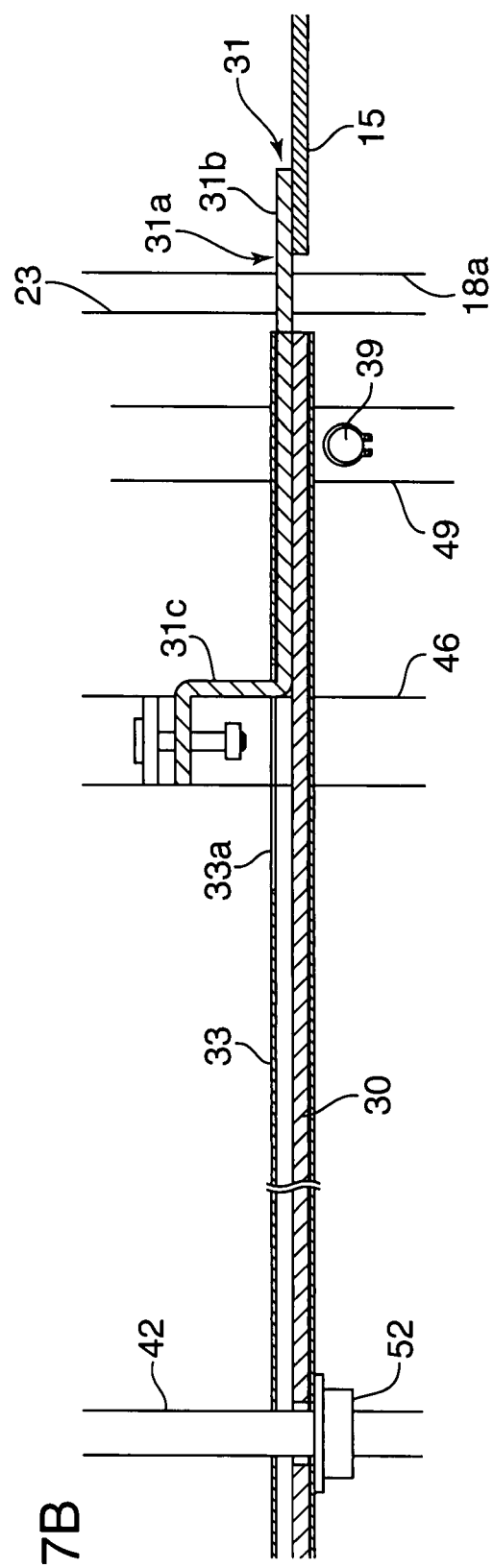

MAGNETIC SHIELDING DOOR AND MAGNETIC SHIELDING ROOM

BACKGROUND OF THE INVENTION

1. Field of the Invention

The present invention relates to a magnetic shielding door and a magnetic shielding room provided with plural members made of a magnetic material.

2. Description of the Related Art

Generally, in order to shield magnetic lines entering inside and shield magnetic lines leaking to the outside, there is a need to surround the room with a magnetic material to secure a passage of magnetic lines by the magnetic material. Hence, for example, in order to construct a magnetic shielding room that shields magnetic lines entering inside from the outside, each wall is necessary to be made of a magnetic material. On the contrary, JP-A-2002-164686 discloses that the magnetic shielding effect can be achieved by configuring in such a manner that a large number of magnetic plates are aligned at intervals within a specific range without the need to hermetically seal the room with magnetic plates. In other words, the room does not have to be sealed hermetically with the magnetic plates as is generally known to achieve the magnetic shielding effect, and it is possible to achieve the magnetic shielding effect with a configuration in which the magnetic plates are aligned at intervals as long as a passage of magnetic lines is secured on the wall surface. JP-A-2002-164686 also discloses that the walls of the magnetic shielding room are formed by aligning magnetic plates of an elongate shape at regular intervals and that arrays of a large number of magnetic plates are provided to the door.

However, JP-A-2002-164686 describes a configuration to provide a large number of magnetic plates to the shielding room and the door, whereas it fails to disclose means necessary to actually put this door to the magnetic shielding room. More specifically, because it is necessary to provide a clearance between the magnetic plates on the door side and the magnetic plates on the wall side for the door to be opened and closed, by merely putting the door disclosed in JP-A-2002-164686 to the magnetic shielding room, the passage of magnetic lines is divided by the clearance, which possibly poses a possibility that the magnetic shielding effect is reduced.

SUMMARY OF THE INVENTION

The invention was devised in view of the foregoing, and therefore has an object to make it possible to secure a desired magnetic shielding effect while securing the opening and closing capability of the magnetic shielding door provided with plural members made of a magnetic body.

In order to achieve the above object, the invention is based on a magnetic shielding door provided to open and close an opening portion defined by plural magnetic members made of a magnetic material aligned at intervals on a circumference thereof, which includes: plural magnetic shielding forming members disposed to respectively correspond to the magnetic members and made of a magnetic body that forms a magnetic shielding in cooperation with the magnetic members, and a movable mechanism that moves the respective magnetic shielding forming members at a door closing position at which the opening portion is closed, wherein the movable mechanism is configured to be capable of moving the respective magnetic shielding forming members between a join position at which the magnetic members and the corresponding magnetic shielding forming members are joined to each other and a spaced-apart position at which the magnetic members and the corresponding magnetic shielding forming members are spaced apart from each other.

According to this configuration, by locating the magnetic shielding forming members at the spaced-apart position, the door can be opened and closed while preventing effectively the magnetic shielding forming members from interfering with the corresponding magnetic members. By moving the respective magnetic shielding forming members so as to be joined to the corresponding magnetic members at the door closing position, it is possible to allow a passage of magnetic lines to continue by bridging between the opening portion and the circumference thereof using the respective magnetic members and the magnetic shielding forming members joined thereto. Consequently, a high magnetic shielding effect can be exerted including the opening portion.

As has been described, according to the invention, because the movable mechanism that moves the magnetic shielding forming members between the join position and the spaced-apart position is provided, it is possible to secure a desired magnetic shielding effect while avoiding an event that the magnetic shielding forming members disturb the door opening and closing capability.

BRIEF DESCRIPTION OF THE DRAWINGS

FIGS. 7A and 7B are an explanatory view describing a movement of a magnetic shielding forming member, FIG. 7A showing a spaced-apart position and FIG. 7B showing a join position.

DETAILED DESCRIPTION OF THE PREFERRED EMBODIMENTS

Hereinafter, the best mode for carrying out the invention will be described in detail with reference to the drawings.

Figure 1:
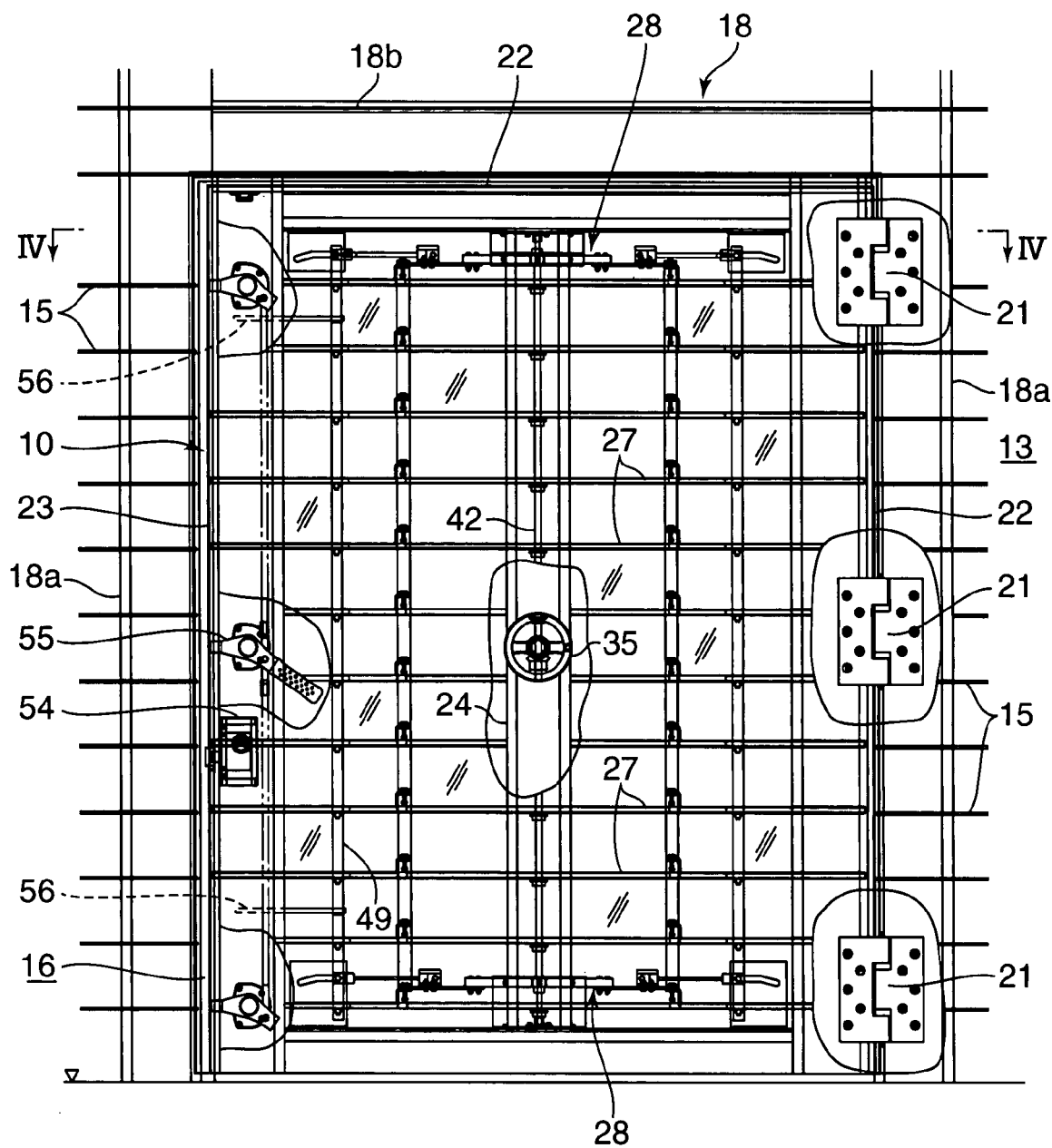
FIG. 1 is a partially broken front view showing the overall configuration of a magnetic shielding door according to a first embodiment of the invention.
Figure 2:
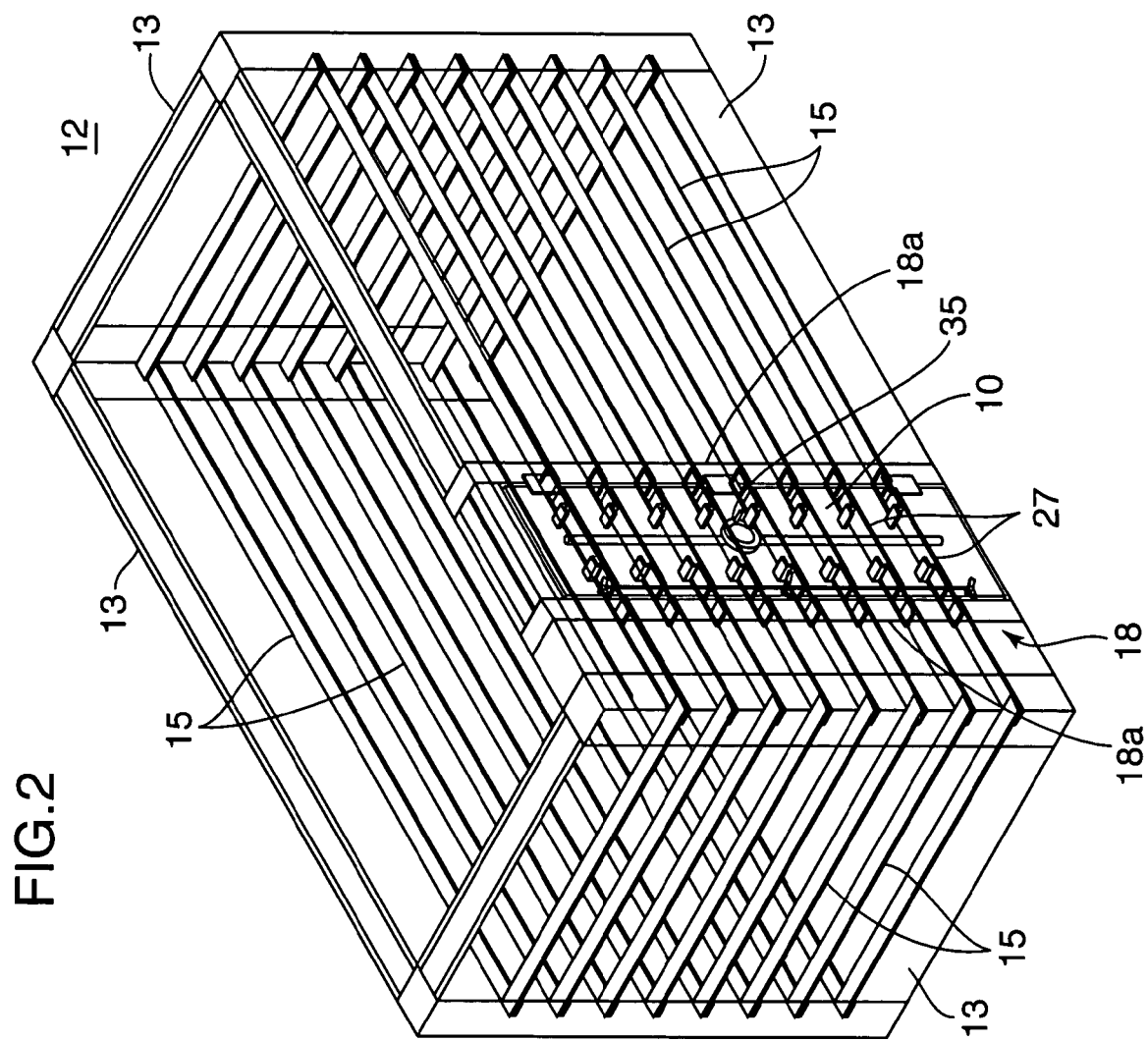
FIG. 2 is a perspective view schematically showing a magnetic shielding room provided with the magnetic shielding door.

As are shown in FIG. 1 and FIG. 2, a magnetic shielding door 10 according to a first embodiment opens and closes the gate as an opening portion provided to a wall portion 13 of a magnetic shielding room 12. FIG. 1 is a view showing the magnetic shielding door 10 when viewed from the front with large areas being broken.

The magnetic shielding room 12 is a room configured in such a manner that the wall portions 13 shield magnetic lines, and each wall portion 13 is provided with a magnetic member group formed of a large number of magnetic members 15 aligned at regular intervals.

Each magnetic member 15 is made of a magnetic material, such as iron and grain-oriented silicon steel. Each of the magnetic members 15 is formed in the shape of an elongate flat plate extending in a particular direction and they are disposed one above another at specific intervals in a posture extending in the horizontal direction. These magnetic members 15 are provided to each wall portion 13 while being joined one to another, so that they go around the magnetic shielding room 12 except for a gate 16.

Figure 3:
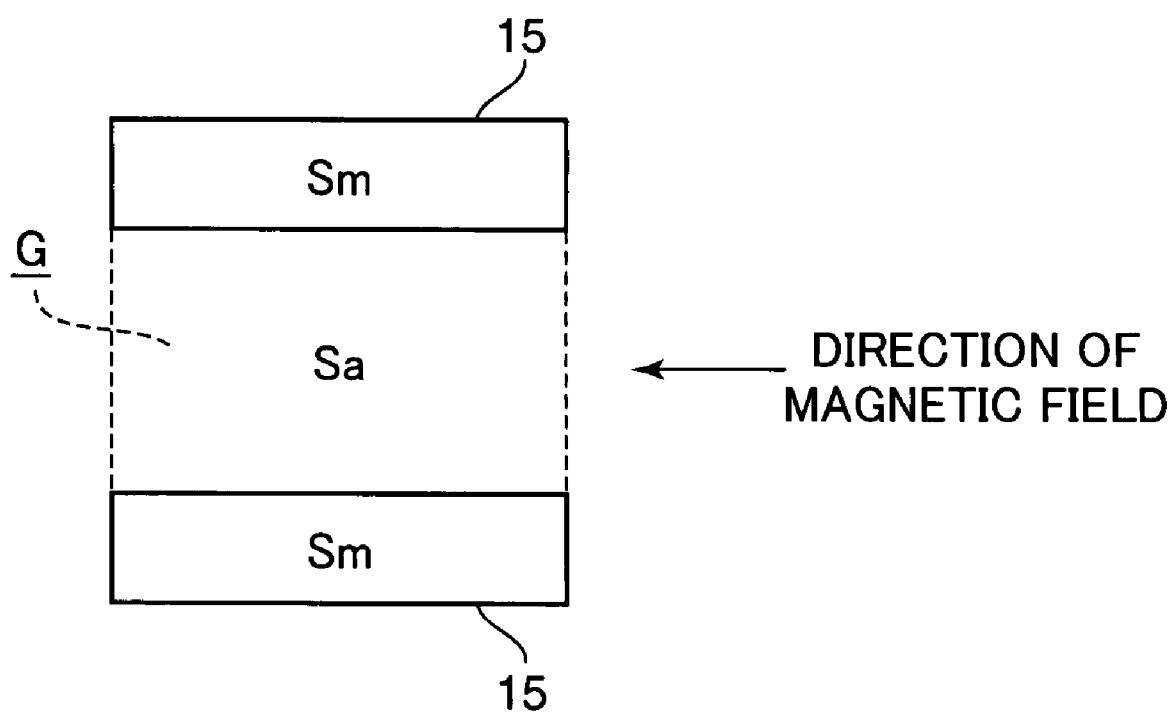
FIG. 3 is an explanatory view describing an interval of magnetic members.

The interval G between the magnetic members 15 is defined as follows. That is, as is shown in FIG. 3, let Sm be the sectional area of each magnetic member 15 in a direction orthogonal to the direction of a magnetic field that needs to be shielded, μs be the relative magnetic permeability of each magnetic member 15, and Sa be the sectional area of the interval G between the adjacent magnetic members 15 in the direction orthogonal to the direction of the magnetic field, then the respective magnetic members 15 are disposed so as to satisfy the following relational expression (1):

$$(Sm \cdot \mu s)/Sa > 1 \qquad (1).$$

As long as the respective magnetic members 15 are disposed so as to satisfy the relation specified above, it is possible to achieve the magnetic shielding effect. In other words, it is possible to suppress a leakage of magnetic lines from inside to outside the room or it is possible to suppress an entry of magnetic lines from outside to inside the room. These magnetic members 15 are sandwiched between a pair of glass plates 17 (see FIG. 4). The drawing shows a case where the magnetic members 15 are aligned at regular intervals. However, as long as the relation expression (1) above is satisfied, the interval G between the adjacent magnetic members 15 does not necessarily stay constant. Likewise, FIG. 2 shows the configuration in which the magnetic member groups are provided to all the wall portions 13. However, the invention is not limited to this configuration, and for example, it may be configured in such a manner that the magnetic member group is provided to only a part of the wall portions 13.

Examples of the magnetic shielding room 12 include an MRI (Magnetic Resonance Imaging) room where a magnetic resonance imaging system (not shown) is installed, a safekeeping room for a transformer (not shown), a manufacturing chamber of semiconductors, and so forth.

The gate 16 is made in any of the wall portions 13 in a rectangular shape. As an example of a fixed body, a frame body 18 is inserted into this wall portion 13. The frame body 18 is of an arch-like shape formed of a pair of vertical members 18a and a cross member 18b that connects the top end portions thereof, and the frame body 18 and the floor surface together form the circumference portion of the gate 16.

Each vertical member 18a is formed in the shape of a square cylinder. Each vertical member 18a is provided with a large number of through-holes (not shown) aligned side by side in the longitudinal direction in the side wall on the side opposite to the gate 16 for the magnetic members 15 to be inserted therein, and in a manner corresponding to these through-holes, through-holes 18c (see FIG. 6) are also made in the side wall on the gate 16 side. Each magnetic member 15 is inserted into the through-hole in the horizontal direction in such a manner that one end thereof protrudes from the side wall on the side opposite to the gate 16 while the other end does not protrude into the gate 16 from the side wall facing the gate 16. In this state, the respective magnetic members 15 are disposed at both the right and left sides of the gate 16.

Figure 4:
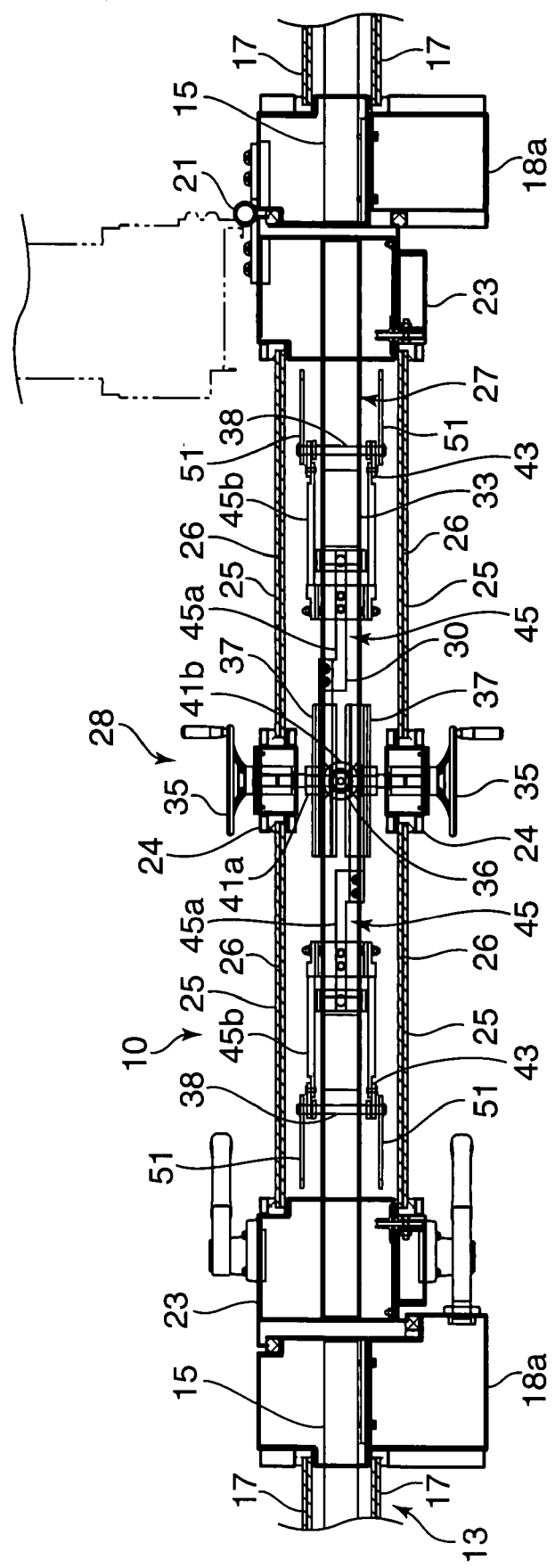
FIG. 4 is a cross section taken on line IV-IV of FIG. 1.

As is shown in FIG. 1, a door hinge portion 21 of the magnetic shielding door 10 according to the first embodiment is fixed to one of the vertical members 18a, and the magnetic shielding door 10 is formed as a hinged door. The magnetic shielding door 10 opens and closes the gate 16 formed by disposing plural magnetic members 15 on the circumference. In FIG. 4, a state at the door closing position at which the magnetic shielding door 10 is closed is indicated by a solid line and an opened state is indicated by a virtual line.

The magnetic shielding door 10 includes top and bottom cross housing frames 22 and right and left vertical housing frames 23, and is formed in a rectangular shape. The magnetic shielding door 10 also includes middle vertical members 24 at the center so as to link the cross housing frames 22 at their centers. As is shown in FIG. 4, two middle vertical members 24 are provided side by side in the door thickness direction.

As an example of a transparent plate, glass plates 25 are fit in between the vertical housing frames 23 and the respective middle vertical members 24. The glass plates 25 make a pair disposed to have an interval in the door thickness direction. This configuration allows the magnetic shielding door 10 to achieve the soundproof effect.

In addition, metal meshes 26 are provided to the glass plates 25. This configuration allows the magnetic shielding door 10 to also achieve the radio wave shielding effect of suppressing passages of radio waves.

The magnetic shielding door 10 includes magnetic shielding forming members 27 and a movable mechanism 28 that moves the magnetic shielding forming members 27.

The magnetic shielding forming members 27 are members that form a magnetic shielding in cooperation with the magnetic members 15. The magnetic shielding forming members 27 are provided in the matching number with the magnetic members 15 inserted through the vertical members 18a of the frame body 18. The magnetic shielding forming members 27 are not only formed in a shape extending in a particular direction, but also disposed one above another at specific intervals in a posture extending in the horizontal direction. This configuration makes it possible to join the magnetic members 15 divided at the gate 16 to each other using magnetic bodies.

Figure 5:
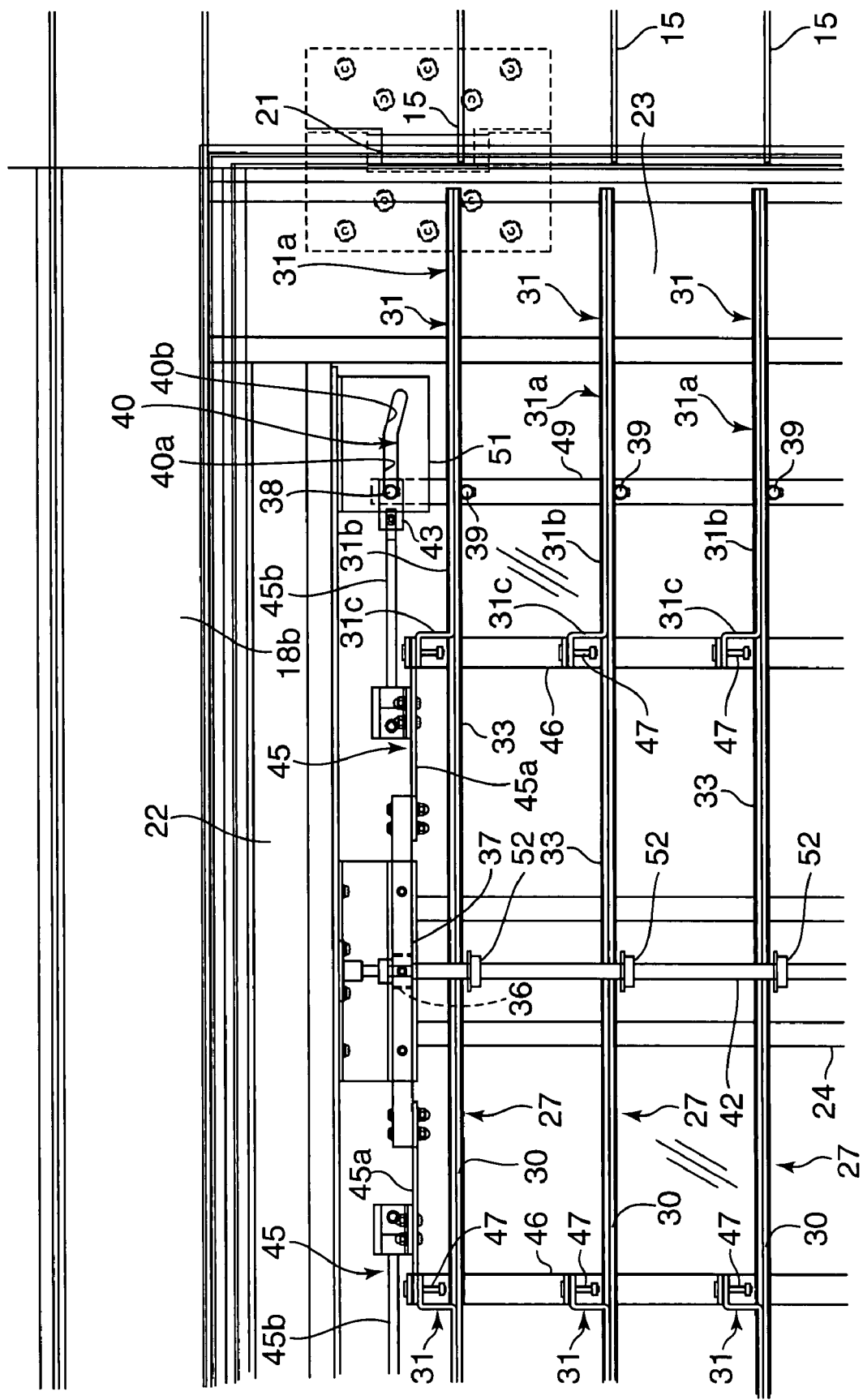
FIG. 5 is an enlarged front view showing a major portion of the magnetic shielding door.

As is shown in an enlarged view of FIG. 5, each magnetic shielding forming member 27 is formed of a fixed member 30 and a movable member 31.

The fixed member 30 is formed in the shape of an elongate rectangular flat plate having a length shorter than the width of the gate 16. The fixed member 30 is formed by laminating plural thin plates made of a magnetic material, such as iron and grain-oriented silicon steel.

The movable member 31 is formed of a pair of movable portions 31a and these movable portions 31a are respectively disposed on the both ends of the fixed member 30. Each movable portion 31a is formed by laminating plural thin plates made of a magnetic material, such as iron and grain-oriented silicon steel. Both the movable portions 31a are of the same shape and disposed symmetrically. Each movable portion 31a is formed of a overlapped portion 31b overlapped on the fixed member 30 and a spaced-apart portion 31c that bends upward from the inner end portion of the overlapped portion 31b while being spaced, apart from the fixed member 30. The top end portion of the spaced-apart portion 31c bends in the horizontal direction and a through-hole (not shown) is made in the horizontal portion.

The fixed member 30 and a pair of the movable portions 31a are held by a holding case 33 as an example of a holding member. The holding case 33 is, for example, made of aluminum and formed in the shape of a square cylinder. The fixed member 30 is immovably accommodated in the holding case 33. Notched portions 33a (see FIG. 7) are made on the top surface portion of the holding case 33 along a specific length. Each notched portion 33a is made in a width wide enough for the movable member 31 to be inserted and of a size large enough to allow the movable member 31 to move as described below. The overlapped portion 31b of the movable portion 31a is accommodated in the holding case 33 while it is put on the fixed member 30, while the spaced-apart portion 31c of the movable portion 31a protrudes upward from the holding case 33 through the notched portion 33a. Because the fixed member 30 and a pair of the movable portions 31a are accommodated in the holding case 33, they will never bend even when disposed horizontally.

The movable mechanism 28 is a mechanism that can move the magnetic shielding forming members 27 between a join position at which the magnetic shielding forming members 27 are joined to the corresponding magnetic members 15 and a spaced-apart position at which the magnetic shielding forming members 27 are spaced apart upward from the magnetic members 15. To be more concrete, the movable mechanism 28 includes rotating handles 35, external gears 36 that rotate in association with the rotating handles 35, a pair of racks 37 engaged with external gears 36, pins 38 linked to the racks 37, supporting members 39 linked to the pins 38, guiding grooves 40 that guide the pins 38, coupling fittings 45 that link the racks 37 to the pins 38, and rotary members 43 provided between the coupling fittings 45 and the pins 38. The external gear 36, a pair of the racks 37, the pins 38, and the guiding grooves 40 are provided at the top portion and the bottom portion of the door 10. Of the foregoing, those provided at the top portion are shown in FIG. 5.

As is shown in FIG. 4, the rotating handles 35 are disposed on the both sides of the magnetic shielding door 10, and each rotating handle 35 is supported on the middle vertical member 24 in a rotatable manner. A bevel gear 41a is provided to the rotating shaft of each rotating handle 35 at the inner end portion, and the bevel gear 41a engages with a bevel gear 41b provided to a coupling shaft 42 extending in the vertical direction in a space between the middle vertical members 24. The coupling shaft 42 is supported between the top and bottom cross housing frames 22 in a rotatable manner.

The external gears 36 are disposed, respectively, at the top end portion and the bottom end portion of the coupling shaft 42. In addition, as is shown in FIG. 4, the racks 37 in each pair sandwich the external gear 36 and are disposed almost parallel to each other. According to this configuration, when the external gear 36 rotates, both the racks 37 start to move oppositely to each other in the door width direction (the right-left direction of FIG. 4).

As is shown in FIG. 1, the pins 38, the supporting members 39, and the guiding grooves 40 are provided on the door hinge 21 side and on the opposite doorway side. Because the configurations are the same, the configurations of those shown in FIG. 5 on the door hinge portion 21 side and on the upper side will be described hereinafter.

The coupling fittings 45 extending horizontally in the door width direction are fastened to the racks 37. Each coupling fitting 45 is formed of a base-end side member 45a and a tip-end side member 45b, and a pin 47 extending downward and having a head with an enlarged diameter at the bottom end portion is provided to the tip end portion of the base-end side member 45a.

The pin 47 of the base-end side member 45a is inserted into the through-hole made in the spaced-apart portion 31c of the movable portion 31a. As the movable portion 31a is coupled to the base-end side member 45a by the pin 47, the movable portion 31a becomes able to move between a retract position at which the external end portion is accommodated in the gate 16 and a protruding position at which the external end portion protrudes outward from the gate 16 in association with the movement of the rack 37. FIG. 5 shows a state where the movable members 31 are at the retract position.

The through-hole is made to have a minor diameter smaller than the head portion of the pin 47 and large enough to allow the spaced-apart portion 31c to move in the vertical direction along the pin 47. Hence, when the movable portion 31a moves, the movable portion 31a is allowed to move in the vertical direction in a state where it is joined to the fixed member 30 in association with a movement in the longitudinal direction of the fixed member 30 while coming into contact with the fixed member 30 at the overlapped portion 31b. A mechanism that moves the fixed member 30 in the vertical direction will be described below.

Vertical members 46 extending in the vertical direction are coupled to the base-end side members 45a. The vertical members 46 are provided to couple two base-end side members 45a disposed at the top portion and the bottom portion, and the respective movable portions 31a aligned side by side in the top-bottom direction are coupled to the vertical members 46. It is therefore configured in such a manner that the respective movable portions 31a move in unison between the retract position and the protruding position in association with the racks 37.

Each tip-end side member 45b is fastened to the base-end side member 45a at the base-end portion while the rotary member 43 is provided to the tip end portion thereof. The rotary member 43 is pin-coupled to the tip-end side member 45b in a rotatable manner about the horizontal shaft, and the pin 38 is disposed at the tip end portion of the rotary member 43. This configuration enables the pin 38 to move in the top-bottom direction.

The pins 38 are respectively coupled to the top end portions and the bottom end portions of coupling members 49 provided to extend in the vertical direction. The coupling members 49 are provided in a pair disposed side by side in the door thickness direction. Hence, the coupling members 49 including the coupling members 49 on the doorway side are disposed at four points in total.

Between the two coupling members 49 provided side by side in the door thickness direction, the supporting members 39 are supported to bridge therebetween. The supporting members 39 are provided in the matching number with the magnetic shielding forming members 27, and these supporting members 39 are aligned in the top-bottom direction at intervals corresponding to the magnetic members 15.

The holding cases 33 are put on the respective supporting members 39. Each holding case 33 is therefore supported at the both ends by the supporting member 39 on the door hinge portion 21 side and the supporting member 39 on the doorway side, and is thereby disposed horizontally.

The holding cases 33 are maintained so that they will not come down below a specific height by stoppers 52 provided to the coupling shaft 42. The stoppers 52 are provided in the matching number with the magnetic shielding forming members 27, and each is provided at the position at which the bottom surface of the movable member 31 does not come below the top surface of the magnetic member 15.

A pin with roller is used as the pin 38, and the pin 38 is inserted into the guiding groove 40 formed in a supporting plate 51. By using a pin with roller as the pin 38, sliding resistance with the guiding groove 40 is reduced. In other words, because loads of the magnetic shielding forming members 27 and the holding cases 33 are applied to the pin 38 via the coupling members 49, the pin 39 is enabled to move smoothly by reducing the sliding resistance with the guiding groove 40.

The supporting plates 51 are fixed to the both end portions of the top and bottom cross housing frames 22. The upper supporting plates 51 are provided to be hung down from the lower end surface of the upper cross housing frame 22 and the lower supporting plates 51 are provided to stand on the top end portion of the bottom cross housing frame 22.

Each guiding groove 40 is formed of a horizontal portion 40a extending horizontally in the door width direction and an inclined portion 40b extending diagonally downward from the tip end (outer end) of the horizontal portion 40a. The inclined portion 40b inclines so as to slope down as it comes closer to the circumference portion of the gate 16.

The horizontal length of the guiding groove 40 is set to a length of a travel distance between the retract position and the protruding position plus a margin sufficient to absorb variances in placement of the respective supporting members 39. Also, the vertical length of the guiding groove 40 is set to a length of a travel distance between the spaced-apart position and the join position plus a margin sufficient to absorb variances in placement of the respective supporting members 39.

As is shown in FIG. 1, the magnetic shielding door 10 is provided with a locking mechanism 54, a handle 55, and locking members 56.

The locking mechanism 54 is disposed on the doorway side, and is provided with a locking bolt that protrudes and retracts so as to engage with the vertical member 18a of the frame body 18.

The handle 55 is to maintain the soundproof effect of the magnetic shielding door 10, and is disposed on the doorway side. It is configured in such a manner that when the handle 55 is rotated, the tip end portion thereof can be pressed against the vertical member 18a of the frame body 18.

Figure 6:
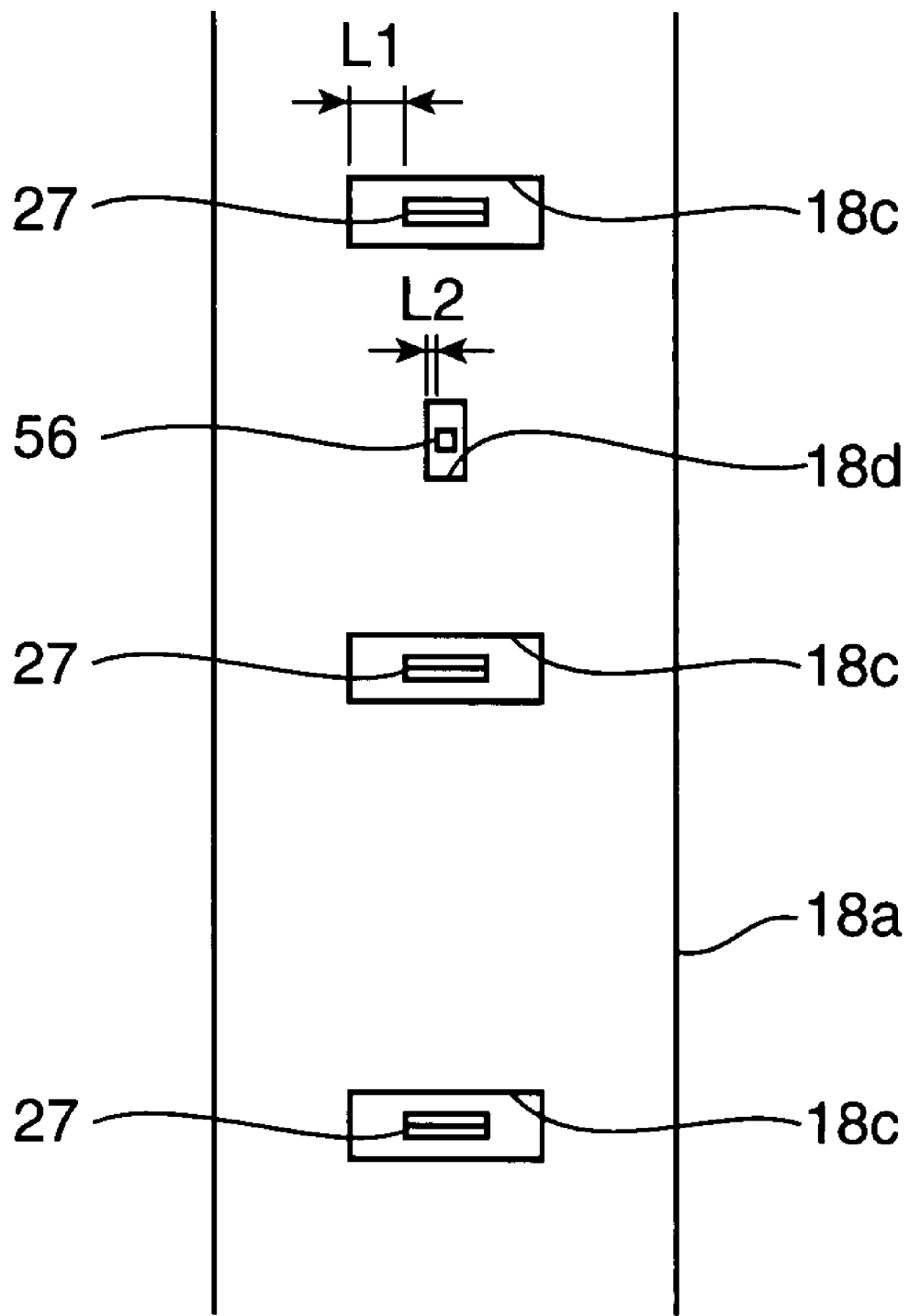
FIG. 6 is a view showing through-holes and an insert-hole made in a vertical member of a frame body.

The locking members 56 prevent the movable members 31 from bumping on the vertical members 18a of the frame body 18. As is shown in FIG. 6, each locking member 56 is inserted into an insert-hole 18d made in the vertical member 18a on the side wall facing the gate 16. Meanwhile, the movable members 31 are allowed to go in and come out from the through-holes 18c. A clearance L2 between the through-hole 18d and the locking member 56 in the door turning direction is made smaller than a clearance L1 between the through-hole 18c and the movable member 31. According to this configuration, even when one tries to open the magnetic shielding door 10 while the movable members 31 are inserted into the through-holes 18c, the locking members 56 fit in the through-holes 18d ahead in time.

The locking members 56 are coupled to the coupling members 49 at the inner end portions. The locking members 56 are configured so as to move between a retract position at which they are accommodated in the gate 16 and a protruding position at which they protrude outward from the gate 16 in association with the movable members 31.

Operations of the magnetic shielding door 10 according to the first embodiment will now be described.

The magnetic shielding door 10 uses the door hinge portion 21 as the shaft and turns between a door closing position at which the gate 16 is closed and a door opening position at which the gate 16 is opened. When the magnetic shielding door 10 turns, the movable members 31 and the locking members 56 are located at the respective retract positions. Hence, as is shown in FIG. 7A, the movable members 31 in this instance do not protrude outward from the vertical housing frames 23.

When the rotating handle 35 is rotated at the door closing position, the coupling shaft 42 starts to rotate about the shaft via the bevel gears 41a and 41b. The external gears 36 thus rotate at the top end portion and the bottom end portion of the coupling shaft 42, and the racks 37 in each pair move oppositely to each other in the horizontal direction, which causes the respective movable members 31 to move toward the protruding position from the retract position. The pins 38 connected to the racks 37 thus move along the guiding grooves 40.

When the pins 38 move in the horizontal portions 40a of the guiding grooves 40, the supporting members 39 coupled to the pins 38 via the coupling members 49 move in the horizontal direction as with the pins 38. The holding cases 33 mounted on the supporting members 39 and the magnetic shielding forming members 27 held therein are therefore maintained at the their disposition heights. The movable members 31 thus move in the horizontal direction to the protruding position while maintaining their heights. In this instance, the holding cases 33 do not undergo displacement.

As the racks 37 move further, the pins 38 move on the inclined portions 40b of the guiding grooves 40. In this instance, the pins 38 move in the top-bottom direction in association with the horizontal movement of the racks 37 as the rotary members. 43 connected to the tip-end side members 45b of the coupling fittings 45 rotate about the horizontal shafts. The supporting members 39 thus move diagonally downward to gradually come down in response to the movable members 31 that are moving toward the protruding position. Consequently, the holding cases 33 and the magnetic shielding forming members 27 mounted on the supporting members 39 come down gradually. However, because the spaced-apart portions 31c of the respective movable portions 31a in this instance move downward so as to move apart from the base-end side members 45a of the coupling fittings 45 along the pins 47, the movable portions 31a are allowed to come down for a horizontal movement of the racks 37. In this manner, the movable members 31 move from the spaced-apart position toward the join position in association with a movement from the retract position at which they do not protrude from the fixed members 30 to the protruding position at which they protrude from the fixed members 30.

Subsequently, as is shown in FIG. 7B, the respective movable members 31 are inserted into the through-holes 18c in the vertical members 18a while they are superimposed on the magnetic members 15 to be mounted thereon. The respective movable members 31 are thus joined to the corresponding magnetic members 15. Accordingly, a passage of magnetic lines that goes around the magnetic shielding room 12 is secured, which enables the magnetic shielding effect to be exerted.

In this instance, in a case where the actual disposed positions of the supporting members 39 vary from a design value, there is a difference in timing at which the respective movable members 31 are joined to the magnetic members 15. In this case, however, even when a part of the movable members 31 are joined to the magnetic members 15, the pins 38 move along the inclined portions 40b of the guiding grooves 40 as the rotating handle 35 is kept rotated thereafter. Hence, the supporting members 39 abutting on the bottom surfaces of the holding cases 33 that have the movable members 31 supported on the magnetic members 15 at the both ends thereof move apart from the holding cases 33 and move downward further while leaving the holding cases 33 at the join position. The rotating handle 35 is stopped rotating when all the movable members 31 are joined to the magnetic members 15. Hence, even in a case where there is a variance in intervals in the moving direction between the respective magnetic shielding members 27 and the corresponding magnetic members 15 at the spaced-apart position, it is possible to joint the respective magnetic shielding forming members 27 to the corresponding magnetic members 15 in reliable manner.

Meanwhile, a movement from the join position to the spaced-apart position is an inverse operation to the operation described above. More specifically, the supporting members 39 move diagonally upward as the pins 38 move from the inclined portions 40b to the horizontal portions 40a of the guiding grooves 40. In association with this movement, the movable members 31 move to the retract position from the protruding position while moving from the join position toward the spaced-apart position located above. The movable members 31 thus retract into the holding cases 33. In this state, the magnetic shielding door 10 is allowed to turn from the door closing position to the door opening position.

As has been described, in the first embodiment, by locating the magnetic shielding forming members 27 at the spaced-part position, the magnetic shielding door 10 can be opened and closed while preventing effectively the magnetic shielding forming members 27 from interfering with the corresponding magnetic members 15. By moving the respective magnetic shielding forming members 27 so as to be joined to the corresponding magnetic members 15 at the door closing position, it is possible to allow a passage of magnetic lines to continue by bridging between the gate 16 and the circumference thereof using the respective magnetic members 15 and the magnetic shielding forming members 27 joined thereto. Hence, a high magnetic shielding effect can be exerted while avoiding an event that the magnetic shielding forming members 27 disturb the opening and closing capability of the door 10.

Also, in the first embodiment, because the respective magnetic members 15 and the corresponding magnetic shielding forming members 27 are joined to each other along the longitudinal direction, the joined areas of these members can be increased without having to increase the thicknesses of these members. This makes it easier to secure the magnetic shielding effect.

In the first embodiment, the magnetic shielding forming members 27 and the magnetic members 15 are disposed in a posture extending in the horizontal direction and the magnetic shielding forming members 27 are joined to the magnetic members 15 from above at the join position. It is thus possible to join these members to each other by utilizing the own weights of the magnetic shielding forming members 27. This eliminates the need to additionally provide separate pressing means, and even in a case where the pressing means is additionally provided, the one with a simple configuration is sufficient. It is thus possible to suppress the configuration of the magnetic shielding door 10 from becoming complex.

Moreover, it is configured in such a manner that when the supporting members 39 supporting the magnetic shielding members 27 move down, they are able to move downward further by leaving the magnetic shielding forming members 27 at the join position. Hence, even in a case where there is a variance in intervals in the moving direction between the respective magnetic shielding forming members 27 and the corresponding magnetic members 15 at the spaced-apart position, it is possible to join the respective magnetic shielding forming members 27 to the corresponding magnetic members 15 in a reliable manner.

Also, in the first embodiment, each magnetic shielding forming member 27 is formed of the fixed member 30 and the movable member 31, and it is configured in such a manner that neither the fixing member 30 nor the movable member 31 protrudes from the vertical housing frame 23 at the retract position of the movable member 31. It is thus possible to prevent the magnetic shielding forming members 27 from interfering with the vertical members 18a of the frame body 18 by opening and closing the door 10 while these members are located at the retract position.

Further, in the first embodiment, it is configured in such a manner that the movable members 31 move between the spaced-apart position and the join position while they move between the retract position and the protruding position. Hence, even in a case where the movable members 31 are configured so as to be able to move between the retract position and the protruding position, it is possible to move the movable members 31 between the spaced-apart position and the join position by a single handling. In addition, because it is configured in such a manner that the movable members 31 are guided as the pins 38 move along the guiding grooves 40, it is possible to join the movable members 31 to the magnetic members 15 in the longitudinal direction smoothly and in a reliable manner.

In the first embodiment, each movable member 31 is formed of a pair of the movable portions 31a and these movable portions 31a are configured so as to protrude from the gate 16 in directions opposite to each other. It is thus possible to secure the joining of the magnetic members 15 disposed on the both sides with the opening portion in between via the fixing members 30 and the both movable members 31a.

In the first embodiment, it is configured in such a manner that the rotary members 43 that are supported on the coupling fittings 45 in a rotatable manner and allow the pins 38 to move in the top-down direction are provided. Hence, the pins 38 become able to move along the guiding grooves 40 smoothly in response to a movement of the racks 37 in the horizontal direction.

In the first embodiment, because the stoppers 52 that prevent the movable members 31 from coming down below a specific height are provided, the bottom end surfaces of the movable members 31 will never come down below the top surfaces of the magnetic members 15. It is thus possible to avoid an event that the movable members 31 and the magnetic members 15 hit each other when the movable members 31 protrude to the protruding position and they are not joined to each other in a direction orthogonal to the longitudinal direction.

In the first embodiment, because the magnetic shielding forming members 27 are held by the corresponding holding cases 33, the fixing members 30 and the movable members 31 will never bend, which makes it possible to join the movable members 31 to the magnetic members 15 in a reliable manner.

In the first embodiment, it is configured in such a manner that the coupling members 49 extending in up-and-down direction are provided and the supporting members 39 supporting the respective holding cases 33 are provided to the coupling members 49. Hence, even in a case where a large number of the magnetic shielding forming members 27 are provided, it is possible to move all the magnetic shielding forming members 27 in unison, which can make manipulations to move the magnetic shielding forming members 27 simpler.

In the first embodiment, the locking members 56 that prevent the movable members 31 at the protruding position from abutting on the vertical members 18a of the frame body 18 are provided. Hence, even in a case where one tries to open the magnetic shielding door 10 when the movable members 31 are at the protruding position, it is possible to prevent the movable members 31 from abutting on the vertical members 18a, which can in turn prevent damages on the movable members 31. Moreover, because the locking members 56 are linked to the movable members 31, it is possible to prevent an event that one forgets to move the locking members 56 to the protruding position at the door closing position.

In the first embodiment, because it is configured in such a manner that the glass plates 25 are fit in, it is possible to confer the soundproof property to the magnetic shielding door 10 while securing the light-transmitting property of the door 10. Moreover, because the glass plates 25 are provided side by side in the door thickness direction, a space is generated between the glass plates 25, which can enhance the soundproof effect. Further, because the metal meshes are provided to the glass plates 25, it is possible to confer the radio wave shielding effect to the magnetic shielding door 10.

The summary of this embodiment will be described in the following.

(1) The magnetic members and the magnetic shielding forming members are formed in shapes extending in particular directions and disposed to be parallel to each other at the door closing position, and the movable mechanism is configured to join the respective magnetic members and the corresponding magnetic shielding forming members to each other along a longitudinal direction at the door closing position. It is thus possible to increase the joined areas of these members, which can in turn make it easier to secure the magnetic shielding effect.

(2) The respective magnetic shielding forming members are disposed in a posture extending in a horizontal direction, and the movable mechanism is configured so as to move the magnetic shielding forming members up and down between the join position at which the respective magnetic shielding forming members are on the corresponding magnetic members to be joined with its own weights and the spaced-apart position located above the join position. It is thus possible to keep the both members joined to each other by utilizing the own weights of the magnetic shielding forming members. This eliminates the need to additionally provide separate pressing means, and even in a case where the pressing means is additionally provided, the one with a simple configuration is sufficient. It is thus possible to suppress the configuration of the magnetic shielding door from becoming complex.

(3) The movable mechanism includes supporting members that support the respective magnetic shielding forming members from below and configured so as to be able to move up and down, and the supporting members are configured so as to be able to move downward further by leaving the magnetic shielding forming members at the join position when moving down from a state where the supporting members hold the magnetic shielding forming members at the spaced-apart position. Hence, even in a case where there is a variance in intervals in the moving direction between the respective magnetic shielding forming members at the spaced apart position and the corresponding magnetic members, it is possible to join the respective magnetic shielding forming members to the corresponding magnetic members in a reliable manner.

(4) Each of the magnetic shielding forming members comprises a fixed member made of a magnetic body disposed so as to be accommodated in the opening portion at the door closing position and formed in a shape extending in a particular direction and a movable member overlapped the fixed member and made of a magnetic body provided so as to move in a longitudinal direction relatively with respect to the fixed member, and the movable member is configured so as to be able to move between a retract position at which the movable member is accommodated in the opening portion and a protruding position at which the movable member protrudes outward from the opening portion at the door closing position, and is configured to be joined to the corresponding magnetic member at the protruding position. Hence, because both the movable member and the fixed member forming the magnetic shielding forming member are accommodated in the opening portion at the retract position, even when the opening portion is formed of a frame body, by locating the magnetic shielding forming members at the retract position, it is possible to prevent the magnetic shielding forming members from interfering with the frame body on the circumference of the opening portion when opening and closing the door.

(5) The movable member is configured so as to move from the spaced-apart position to the join position in association with a movement from the retract position to the protruding position, while moving from the join position to the spaced-apart position in association with a movement from the protruding position to the retract position. Hence, even in a case where the movable member is configured to be able to move between the retract position and the protruding position, it is possible to move the movable member between the spaced-apart position and the join position by a single handling.

(6) The movable mechanism includes a pin moving in association with supporting member that supports the fixed member and a guiding groove that guides the pin so that the movable member comes closer to the magnetic member with an increase of relative displacement in the longitudinal direction between the fixed member and the movable member. It is thus possible to join the movable member to the magnetic member along the longitudinal direction smoothly in a reliable manner.

(7) Each movable member is formed of a pair of movable portions provided so as to be able to move in directions opposite to each other, and one of a pair of the movable portions is provided so as to be joined to one of the magnetic members disposed on both sides with the opening portion in between, and the other movable portion is provided to be joined to the other one of the magnetic members disposed on the both sides with the opening portion in between. The respective movable portions are thus allowed to protrude toward the sides opposite to each other with respect to the opening portion, which makes it possible to secure the joining of the magnetic members disposed on the both sides with the opening portion in between via the fixed member and the both movable portions.

(8) A pair of racks disposed so as to sandwich an external gear and to be almost parallel to each other is provided, and one of the racks is coupled to one of a pair of the movable portions and the other the rack is coupled to the other movable portion.

(9) Each of the magnetic shielding forming members is disposed in a posture extending in a horizontal direction, and a coupling fitting coupled to the rack and capable of moving horizontally together with the rack and a rotary member that is supported on the coupling fitting in a rotatable manner and allows the pin to move in an up-and-down direction are provided. The pin thus becomes able to move along the guiding groove smoothly in response to a movement of the rack in the horizontal direction.

(10) A stopper that prevents a bottom surface of the movable member from coming down below a top surface of the corresponding magnetic member is provided. Hence, because the bottom surface of the movable member will never come down below the top surface of the magnetic member, it is possible to avoid an event that the movable member and the magnetic member hit each other and these members cannot be joined to each other along the longitudinal direction when the movable member protrudes to the protruding position.

(11) Holding members that hold the magnetic shielding forming members are provided for the respective magnetic shielding forming members, and each holding member is configured so as to hold the fixed member while allowing the movable member to move. It is thus possible to maintain the positional relation between the movable member and the magnetic member at a high degree of accuracy, which consequently enables the both members to be joined to each other in a reliable manner.

(12) A coupling member that moves each of the holding members between the join position and the spaced-apart position without changing a positional relationship with respect to one another is provided. Hence, even in a case where a large number of magnetic shielding forming members are provided, it is possible to move all these magnetic shielding forming members in unison, which makes manipulations to move the magnetic shielding forming members simpler.

(13) A locking member that prevents the movable member from coming into contact with a fixed body on the circumference of the opening portion is provided, and the locking member is configured so as to move to a position at which the locking member is able to come into contact with the fixed body in association with a movement of the movable member to the protruding position, and to evacuate from the fixed body in association with a movement of the movable member to the retract position. Hence, even when one tries to open the magnetic shielding door when the movable members are at the protruding position, the locking member prevents the door from being opened by coming into contact with the fixed body. It is thus possible to prevent damages on the movable member made when they accidentally hit the fixed body. Moreover, because the locking member is linked to the movable members, it is possible to prevent an event that one forgets to move the locking member to a position at which hitting is allowed at the door closing position.

(14) Transparent plates are provided to bridge between the respective magnetic shielding forming members. It is thus possible to shut an air flow through the door while securing the light-transmitting property of the door.

(15) The transparent plates are provided with metal meshes. It is thus possible to confer the radio wave shielding effect to the magnetic shielding door.

(16) The transparent plates are made in a pair to sandwich the magnetic shielding forming members. Hence, by forming a space between the transparent plates, the soundproof effect can be exerted.

(17) In a magnetic shielding room provided with a magnetic member group in which magnetic members made of a magnetic material are aligned at intervals is provided to form at least a part of walls, the magnetic member group is provided with an opening portion along a plurality of the magnetic members, and the opening portion is provided with the magnetic shielding door so as to open and close the opening portion.

Figure 8:
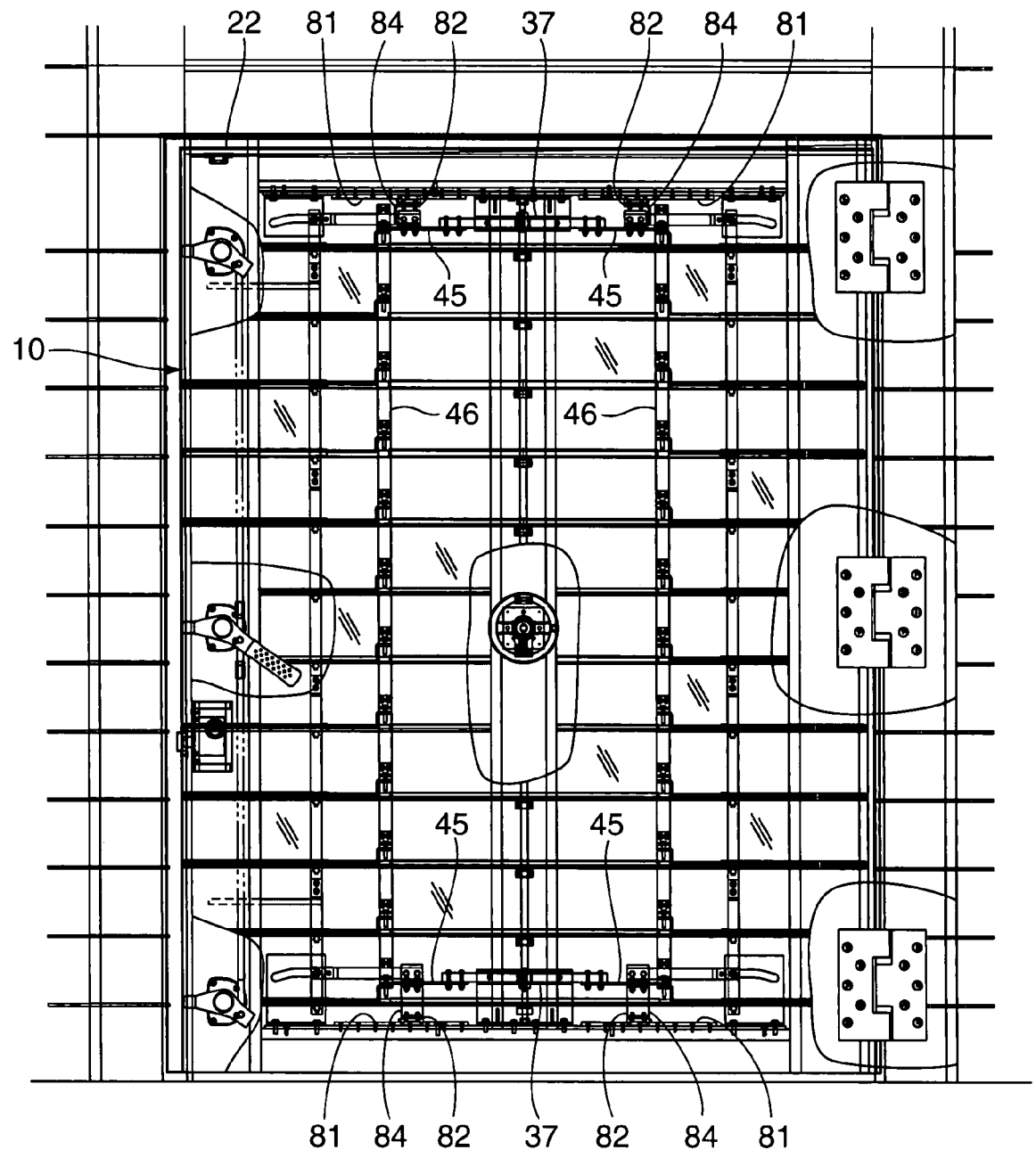
FIG. 8 is a view corresponding to FIG. 1 and showing a magnetic shielding door according to a second embodiment of the invention.
Figure 9:
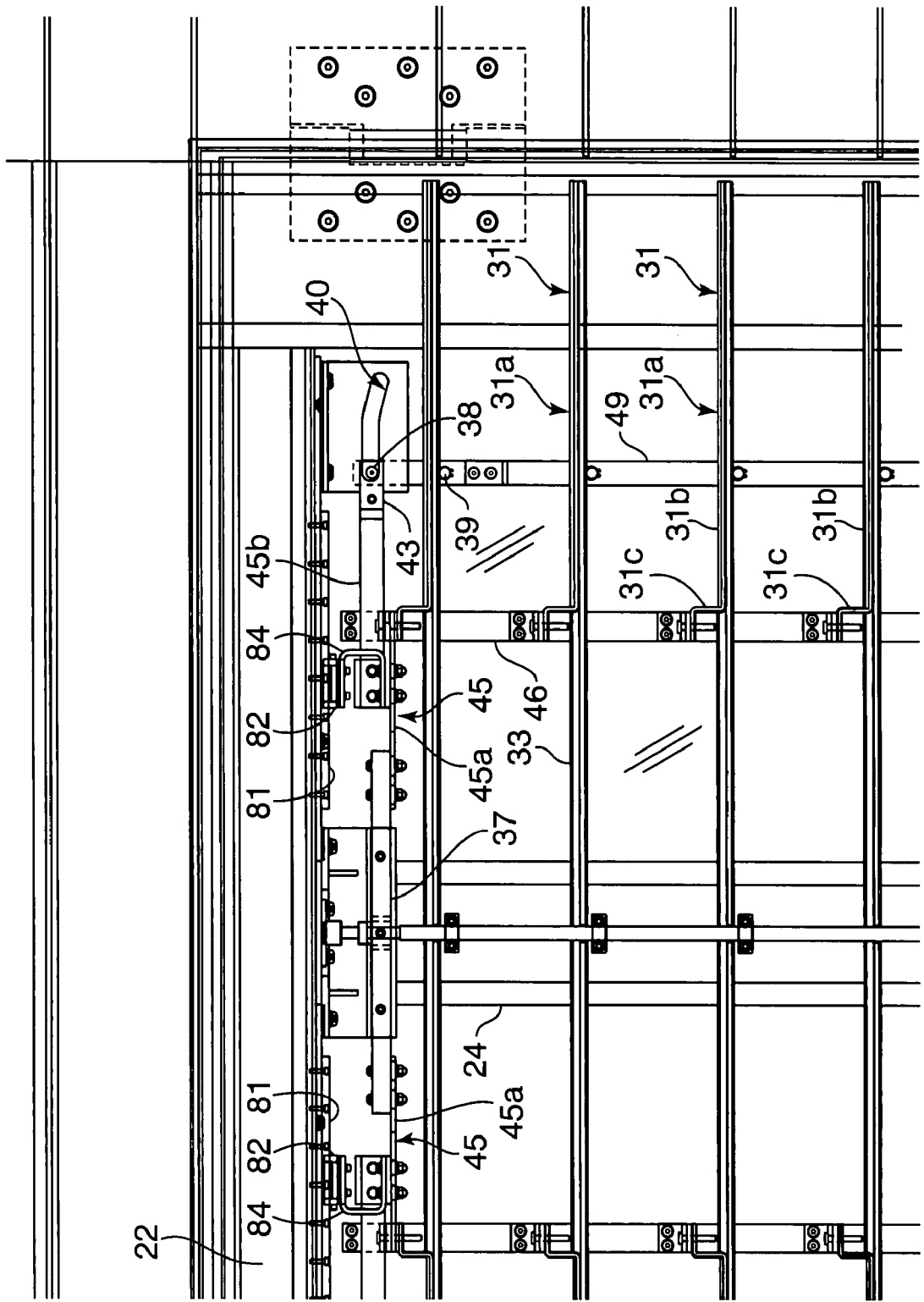
FIG. 9 is an enlarged front view showing a major portion of the magnetic shielding door.

FIG. 8 and FIG. 9 show a second embodiment of the invention. The second embodiment is configured in such a manner that linear guides 81 to guide the racks 37 are provided.

To be more concrete, the linear guides 81 are provided at the top portion and the bottom portion of the magnetic shielding door 10, and the upper linear guides 81 are provided in a posture extending linearly in the horizontal direction and fastened to the bottom surface of the upper cross housing frame 22. Meanwhile, the lower linear guides 81 are provided in a posture extending linearly in the horizontal direction and fastened to the top surface of the lower cross housing frame 22. The configurations on the upper side and the lower side are the same except that they are upside down, and the upper configuration is shown in an enlarged view of FIG. 9.

As is shown in the drawing, the upper linear guides 81 are disposed on the both sides with the middle vertical members 24 in between, and a slider 82 is provided to each linear guide 81 in a slidable manner. The slider 82 is provided with a guiding groove (not shown) in the top end portion, and the guiding groove is formed to widen at the bottom portion while the linear guide 81 is formed to widen at the bottom portion in a corresponding manner. It is thus possible for the slider 82 to slide in the horizontal direction along the linear guide 81 without falling out from the linear guide 81.

The slider 82 is disposed directly above the coupling fitting 45, and coupled to the base-end side member 45a of the coupling fitting 45 via a bracket 84. The slider 82 thus moves in association with the rack 37. In other words, the rack 37 is guided by the linear guide 81 when moving horizontally.

The lower linear guides 81 are disposed upside down with respect to the upper linear guides 81, so that the slier 82 moves along the top surface of the linear guide 81. The slider 82 is provided with the bracket 84 to extend upward from the slider 82, and the top end portion thereof is coupled to the base-end side member 45a. The slider 82 is configured to move in association with the rack 37.

The reason why the rack 37 is guided by the linear guide 81 as described above is as follows. That is, the rack 37 undergoes loads of the coupling fitting 45 and the vertical member 46 at the tip end portion, and there is a possibility that the rack 37 moves up and down due to the influence of the loads while moving in the horizontal direction and fails to engage with the external gear 36 smoothly. Hence, by providing the linear guide 81 to extend in the horizontal direction and coupling the rack 37 to the slider 82 of the linear guide 81 via the bracket 84, it is possible to guide the rack 37 by the linear guide 81. Consequently, because it is possible to suppress the rack 37 from moving up and down while moving horizontally, the external gear 36 and the rack 37 engage with each other in a stable manner, which allows the rack 37 to move smoothly.

The other configurations, functions, and the effects are the same as those achieved in the first embodiment.

The summary of the embodiment will be described in the following.

(1) A linear guide provided to extend in the horizontal direction and provided with a slider that is allowed to slide thereon and a bracket that couples the coupling fitting and the slider to each other are provided. It is thus possible to guide the rack using the linear guide, which can suppress the rack from moving up and down while moving horizontally. Hence, the external gear and the rack can be engaged with each other in a stable manner, which allows the rack to move smoothly.

Figure 10:
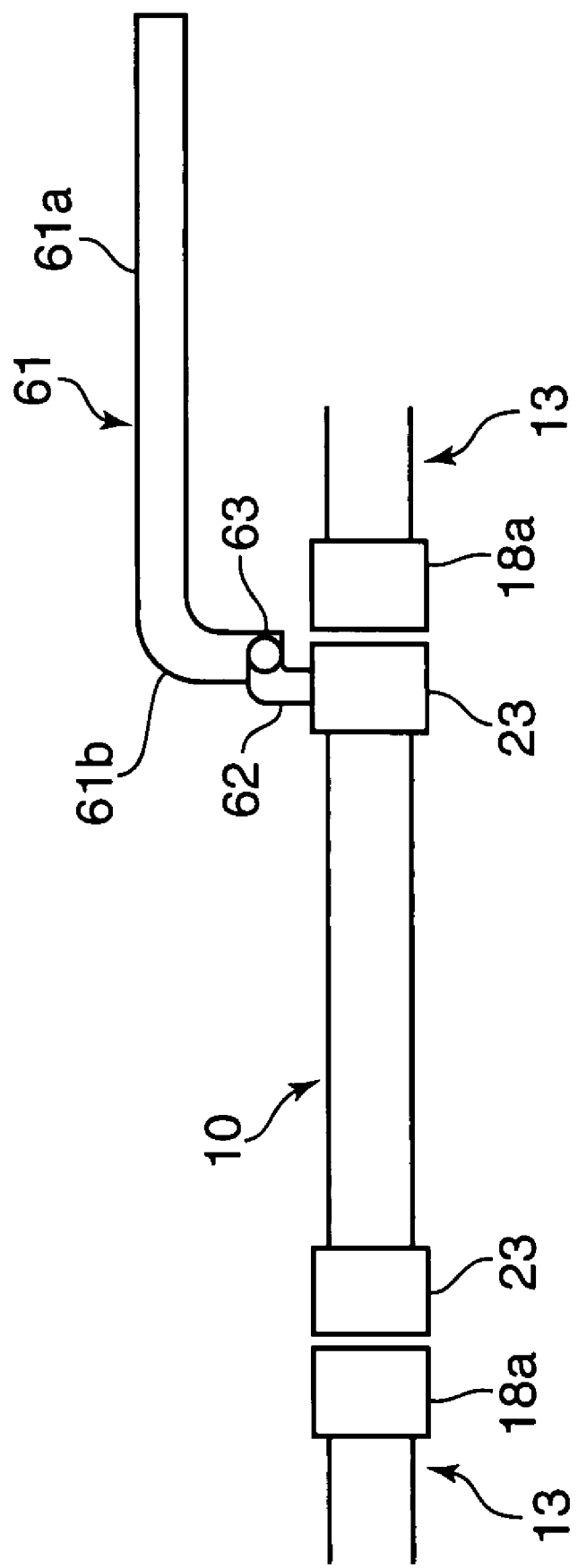
FIG. 10 is a schematic view schematically showing a magnetic shielding door according to a third embodiment of the invention.

The first and second embodiments have described a case where the magnetic shielding door 10 is formed as a hinged door. In a third embodiment, as is shown in FIG. 10, for example, the magnetic shielding door 10 is formed as a sliding door. This magnetic shielding door 10 is configured to include a guiding rail 61 extending along the wall portion 13 and a door hanger 62 that runs along the guiding rail 61.

The guiding rail 61 is formed of a linear portion 61a extending along the wall portion 13 and a curved portion 61b curving toward the gate 16 in the vicinity of the vertical member 18a. The door hanger 62 includes a wheel 63 that rolls on the guiding rail 61 and suspends the magnetic shielding door 10. The magnetic shielding door 10 moves linearly along the wall portion 13 in the vicinity of the door opening position while it moves to fit in the gate 16 by changing the moving directions near the gate 16 and is located at the door closing position. Operations at the door closing position are the same as described above.

Figure 11:
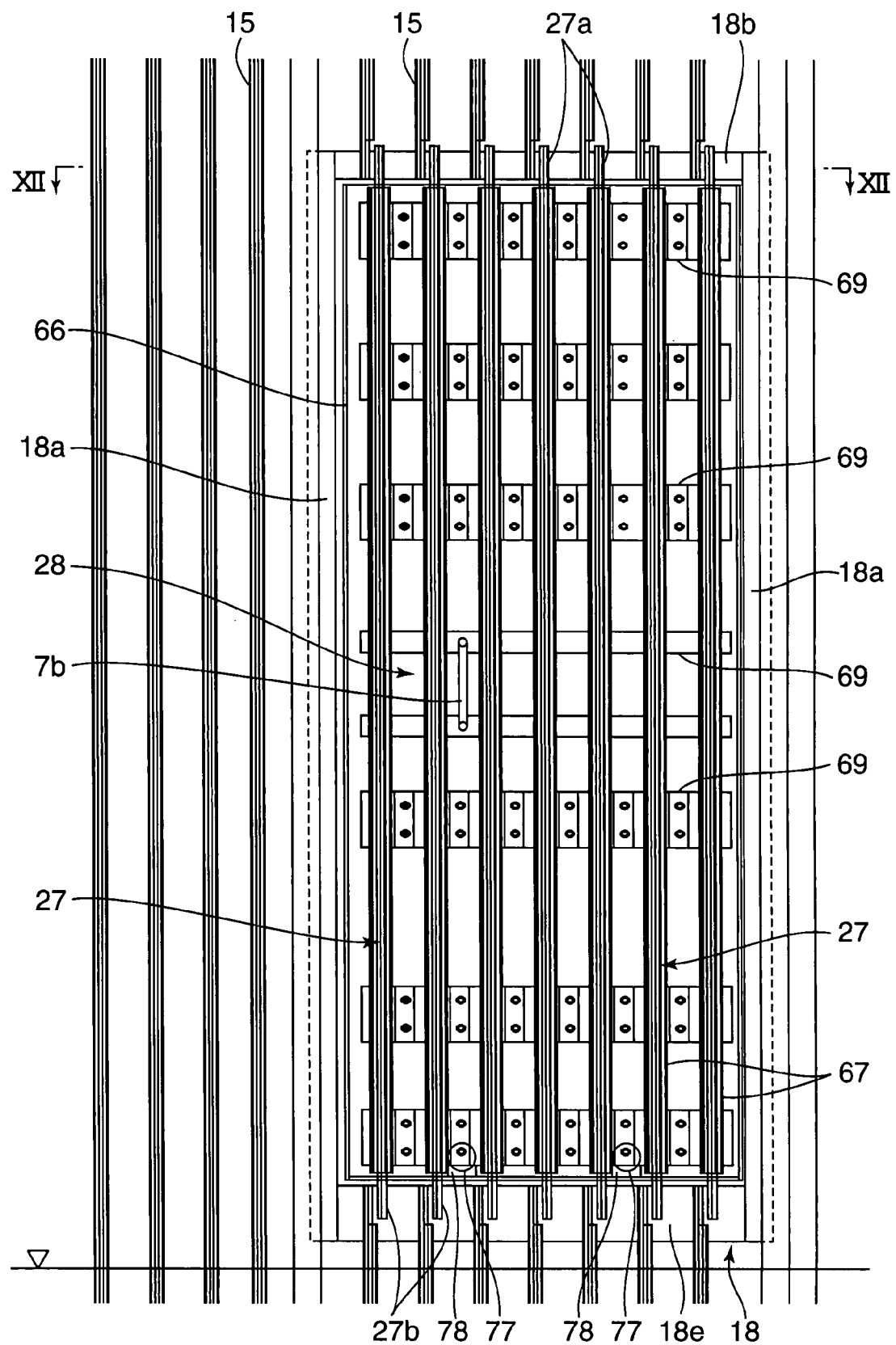
FIG. 11 is a partially broken front view showing the overall configuration of a magnetic shielding door according to a fourth embodiment of the invention.

FIG. 11 shows a fourth embodiment of the invention. In the fourth embodiment, the magnetic shielding generating members 27 are not configured so as to move between the retract position and the protruding position, and they are allowed to move between the join position and the spaced-apart position alone.

Figure 12:
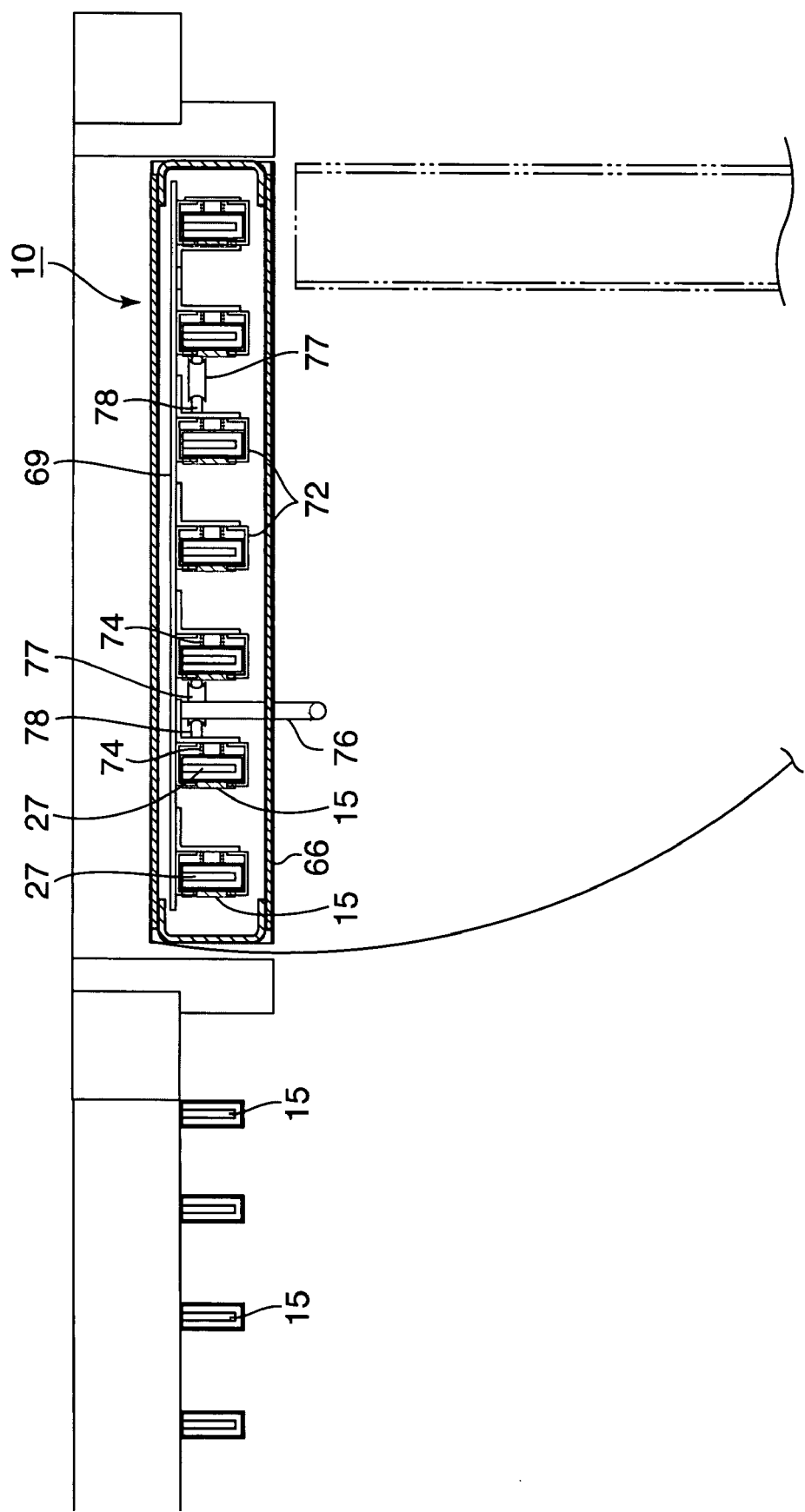
FIG. 12 is a cross section take on line XII-XII of FIG. 11.

The frame body 18 forming the gate 16 includes a crosswise pair of vertical members 18a and vertical pair of cross members 18b and 18e, and is formed in the shape of a rectangular frame body. In FIG. 12, the door closing position is indicated by a solid line and the door opening position is indicated by a virtual line.

Different from the first embodiment, the magnetic members 15 provided to the wall portions 13 are disposed in a posture extending in the vertical direction and aligned in the horizontal direction at specific intervals. Plural magnetic members 15 are provided at both the upper portion and lower portion of the frame body 18. The magnetic members 15 at the upper portion are provided so that the bottom end portions thereof will not protrude downward below the upper cross member 18b of the frame body 18, while the magnetic members 15 at the lower portion are provided so that the top end portions thereof will not protrude upward above the lower cross member 18e of the frame body 18. These magnetic members 15 are joined to the side surfaces of the cross members 18b and 18e on the door opening side.

The magnetic shielding door 10 includes a frame portion 66 in the shape of a rectangular frame, plural magnetic shielding forming members 27, plural holding sleeves 67 to hold the respective magnetic shielding forming members 27, coupling members 69 to couple these holding sleeves 67 one to another, and a movable mechanism 28 that moves the magnetic shielding forming members 27 between the join position and the spaced-apart position. An unillustrated door hinge portion is provided to the vertical member (for example, the vertical member on the right of FIG. 11) of the frame portion 66, and the magnetic shielding door 10 is therefore formed as a hinged door.

As with the magnetic members 15, the magnetic shielding forming members 27 are disposed in a posture extending in the vertical direction and aligned in the horizontal direction at specific intervals.

Each holding sleeve 67 is of the shape of an elongate square cylinder extending in an up-and-down direction, and has a length comparable to the height of the gate 16. The magnetic shielding forming member 27 penetrates through the holding sleeve 67. The magnetic shielding forming member 27 protrudes upward and downward from the holding sleeve 67. The top end portion 27a of the magnetic shielding forming member 27 is disposed at a position as high as the upper cross member 18b of the frame body 18 and the bottom end portion 27b is disposed at a position as high as the lower cross member 18e. In other words, the magnetic shielding members 27 are formed to protrude upward and downward from the gate 16. As with the magnetic members 15, the top end portions 27a and the bottom end portions 27b of the magnetic shielding forming members 27 are positioned at the door opening side of the cross members 18b and 18e.

The coupling members 69 are formed in a shape extending in the horizontal direction and a plurality of them are provided one above another at specific intervals.

As is shown in FIG. 12, plural holding brackets 72 aligned in the horizontal direction at specific intervals are immovably fastened to each coupling member 69. Each holding bracket 72 is formed in a shape surrounding the holding sleeve 67 and the holding sleeve 67 is disposed inside the holding bracket 72. The holding sleeve 67 is provided to penetrate through the holding bracket 72 of each of the coupling members 69 aligned in the top-bottom direction, and the holding sleeves 67 and the coupling members 69 are provided in a lattice-like arrangement.

A coil spring 74 as an example of pushing means is provided between the holding bracket 72 and the holding sleeve 67. The coil spring 74 is configured so as to push the magnetic shielding forming member 27 in a direction heading toward the join position from the spaced-apart position. For example, the coil spring 74 pushes the holding sleeve 67 from right to left of FIG. 12.

When the magnetic shielding forming member 27 is at the join position at which it is joined to the magnetic member 15 on its left, the magnetic shielding forming member 27 is pressed against the magnetic member 15 by an elastic force of the coil spring 74. The pushing force of the coil spring 74 is a pushing force weaker than a pressing force from the magnetic member 15 that the magnetic shielding forming member 27 undergoes when joined to this magnetic member 15. Hence, even in a case where the magnetic shielding forming member 27 is provided at a position slightly displaced from the predetermined position, the positional displacement of the magnetic shielding forming member 27 is absorbed as the coil spring 74 contracts at the join position, which secures the joining to the magnetic member 15.

The movable mechanism 28 includes a handle 76 and wheels 77. The handle 76 is fixed to the coupling member 69 provided at an intermediate height. The wheels 77 are supported on the coupling member 69 provided at the lowermost position in a rotatable manner. The wheels 77 are configured to roll on rails 78 provided to extend in the door width direction (the right-left direction of FIG. 11) in a part of the bottom end of the frame portion 66 of the door 10.

Figure 13:
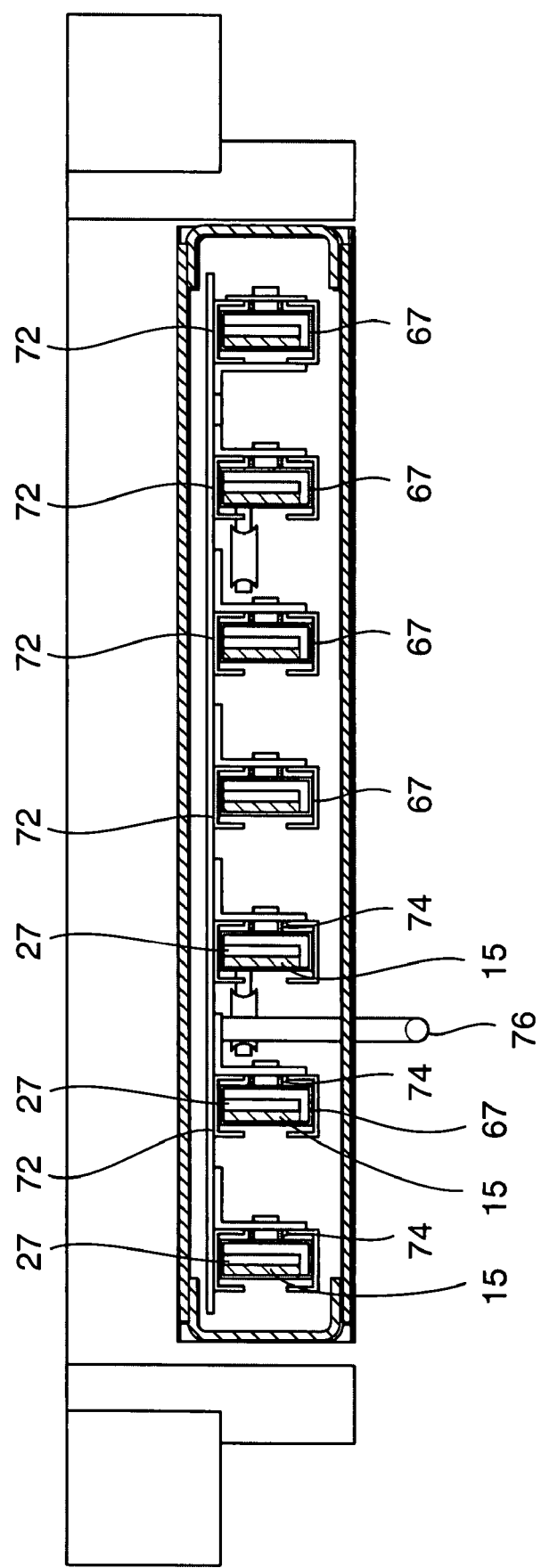
FIG. 13 is a view showing a joined state of the magnetic members and the magnetic shielding forming members of FIG. 12.

In the fourth embodiment, when the magnetic shielding forming members 27 are at the spaced-apart position, by manipulating the handle 76 in the leftward direction of FIG. 12, the respective magnetic shielding forming members 27 start to move horizontally in the leftward direction while maintaining the shape and the positional relation. Then, as is shown in FIG. 13, when the magnetic shielding forming members 27 come into contact with the magnetic members 15 at the top end portions 27a and the bottom end portions 27b, the coil springs 74 contract, which causes the holding sleeves 67 attached to the magnetic shielding forming members 27 to undergo displacement relatively with respect to the holding brackets 72. When the manipulation of the handle 76 ends as the coupling members 69 are positioned on the left side, the respective magnetic shielding forming members 27 and the corresponding magnetic members 15 are joined to each other toward the sides of the cross members 18b and 18e of the frame body 18.

As has been described, according to the fourth embodiment, it is possible to keep the magnetic shielding forming members 27 joined to the magnetic members 15 by the pushing forces of the coil springs 74. Moreover, even in a case where there is a variance in the position relation in the moving direction of the magnetic shielding forming members 27, because the magnetic shielding forming members 27 putting into contact with the magnetic members 15 are allowed to move in a direction opposite to the pushing direction by the spring coils 74, the variance in the positional relation can be absorbed. It is thus possible to secure the joining of all the magnetic shielding forming members 27.

In the fourth embodiment, because it is not configured in such a manner that the magnetic shielding forming members 27 move between the retract position and the protruding position, the movable mechanism 28 can be of a simpler configuration than the counterpart in the first embodiment. On the contrary, in the first embodiment, because the magnetic shielding forming members 27 are allowed to move to the retract position at which the movable members 31 of the magnetic shielding forming members 27 are accommodated in the gate 16, it is possible to prevent effectively the magnetic shielding forming members 27 from interfering with the frame body 18.

Different from the first embodiment, because no glass plates are provided in the fourth embodiment, it is possible to secure the air permeability of the magnetic shielding room 12. This embodiment is therefore effective even in a case where a heat source is provided inside the chamber.

In the fourth embodiment, too, the magnetic shielding door 10 can be formed as a sliding door. Although descriptions are omitted herein, the other configurations, functions, and effects are the same as those in the first embodiment.

The summary of this embodiment will be described in the following.

(1) The respective magnetic shielding forming members are disposed in a posture extending in a vertical direction, and holding brackets to hold the respective magnetic shielding forming members are provided, and pushing means are provided between the holding brackets and the respective magnetic shielding forming members, the pushing means pushing the respective magnetic shielding forming members in a direction to come closer to the magnetic members corresponding to the magnetic shielding forming members, and allowing the magnetic shielding forming members putting into contact with the magnetic members to move in an opposite direction when moving to the join position from the spaced-apart position. It is thus possible to keep the magnetic shielding forming members joined to the magnetic members using the pushing force of the pushing means. Moreover, even in a case where there is a variance in the position relation in the moving direction of the magnetic shielding forming members, because the magnetic shielding forming members putting into contact with the magnetic members are allowed to move in a direction opposite to the pushing direction by the pushing means, the variance in the positional relation can be absorbed. It is thus possible to secure the joining of all the magnetic shielding forming members.

The invention claimed is:

1. A magnetic shielding door for opening and closing a gate formed in a wall portion of a magnetic shielding room, the wall portion provided with plural magnetic members made of a magnetic material, the magnetic members being aligned at intervals on a circumference of the gate, the magnetic shielding door comprising:

plural magnetic shielding forming members disposed to respectively correspond to the magnetic member and made of a magnetic material that forms a magnetic shielding in cooperation with the magnetic members, the respective magnetic shielding forming members being disposed in a posture extending in a horizontal direction; and a movable mechanism that moves the respective magnetic shielding forming members at a door closing position at which the gate is closed, the magnetic members and the magnetic shielding forming members being parallel to each other at the door closing position, and being configured to join the respective magnetic members and the corresponding magnetic shielding forming members to each other along a longitudinal direction substantially parallel to the wall portion at the door closing position, the movable mechanism being capable of moving the respective magnetic shielding forming members up and down between a join position at which the respective magnetic shielding forming members are on the corresponding magnetic members to be joined with its own weights and a spaced apart position located above the join position at which the magnetic members and the magnetic shielding forming members are spaced apart from each other in the longitudinal direction.

2. A magnetic shielding door for opening and closing a gate formed in a wall portion of a magnetic shielding room, the wall portion provided with plural magnetic members made of a magnetic material, the magnetic members being aligned at intervals on a circumference of the gate, the magnetic shielding door comprising:

plural magnetic shielding forming members disposed to respectively correspond to the magnetic members and made of a magnetic material that forms a magnetic shielding in cooperation with the magnetic members, the respective magnetic shielding forming members being disposed in a posture extending in a vertical direction;

a movable mechanism that moves the respective magnetic shielding forming members in a longitudinal direction substantially parallel to the wall portion at a door closing position at which the gate is closed, the magnetic members and the magnetic shielding forming members being parallel to each other at the door closing position, and being configured to join the respective magnetic members and the corresponding magnetic shielding forming members to each other along the longitudinal direction at the door closing position, holding brackets to hold the respective magnetic shielding forming members; and at least one pusher provided between the holding brackets and the respective magnetic shielding forming members, the pusher pushing the respective magnetic shielding forming members in the longitudinal direction to come closer to the magnetic members corresponding to the magnetic shielding forming members, and allowing the magnetic shielding forming members that have been put into contact with the magnetic members to move in an opposite direction on moving to the join position from the spaced-apart position.

3. A magnetic shielding door provided to open and close an opening portion defined by plural magnetic members made of a magnetic material and aligned at intervals on a circumference thereof, comprising:

plural magnetic shielding forming members disposed to respectively correspond to the magnetic members and made of a magnetic body that forms a magnetic shielding in cooperation with the magnetic members, the respective magnetic shielding forming members being disposed in a posture extending in a horizontal direction; and a movable mechanism that moves the respective magnetic shielding forming members at a door closing position at which the opening portion is closed, the magnetic members and the magnetic shielding forming members being parallel to each other at the door closing position, and being configured to join the respective magnetic members and the corresponding magnetic shielding forming members to each other along a longitudinal direction at the door closing position, the movable mechanism being capable of moving the respective magnetic shielding forming members up and down between a join position at which the respective magnetic shielding forming members are on the corresponding magnetic members to be joined with its own weights and a spaced-apart position located above the join position at which the magnetic members and the corresponding magnetic shielding forming members are spaced apart from each other.

4. The magnetic shielding door according to claim 3, wherein:
the movable mechanism includes supporting members that support the respective magnetic shielding forming members from below and configured so as to be able to move up and down; and
the supporting members are configured so as to be able to move downward further by leaving the magnetic shielding forming members at the join position when moving down from a state where the supporting members hold the magnetic shielding forming members at the spaced-apart position.

5. The magnetic shielding door according to claim 3, further comprising:
transparent plates provided to bridge between the respective magnetic shielding forming members.

6. The magnetic shielding door according to claim 5, wherein:
the transparent plates are provided with metal meshes.

7. The magnetic shielding door according to claim 5, wherein:
the transparent plates are made in a pair to sandwich the magnetic shielding forming members.

8. A magnetic shielding room provided with a magnetic member group in which magnetic members made of a magnetic material are aligned at intervals, the magnetic member group forming at least a part of walls, wherein:
the magnetic member group is provided with an opening portion along a plurality of the magnetic members; and
the opening portion is provided with the magnetic shielding door according to claim 1 so as to open and close the opening portion.

9. A magnetic shielding door provided to open and close an opening portion defined by plural magnetic members made of a magnetic material and aligned at intervals on a circumference thereof, comprising:
plural magnetic shielding forming members disposed to respectively correspond to the magnetic members and made of a magnetic body that forms a magnetic shielding in cooperation with the magnetic members, the respective magnetic shielding forming members are disposed in a posture extending in a vertical direction
a movable mechanism that moves the respective magnetic shielding forming members at a door closing position at which the opening portion is closed, the magnetic members and the magnetic shielding forming members being parallel to each other at the door closing position, and being configured to join the respective magnetic members and the corresponding magnetic shielding forming members to each other along a longitudinal direction at the door closing position;
holding brackets to hold the respective magnetic shielding forming members; and
pusher provided between the holding brackets and the respective magnetic shielding forming members, the pusher pushing the respective magnetic shielding forming members in a direction to come closer to the magnetic members corresponding to the magnetic shielding forming members, and allowing the magnetic shielding forming members putting into contact with the magnetic members to move in an opposite direction on moving to the join position from the spaced-apart position.

10. A magnetic shielding door for opening and closing a gate formed in a wall portion of a magnetic shielding room, the wall portion provided with plural magnetic members made of a magnetic material, the magnetic members being aligned at intervals on a circumference of the gate, the magnetic shielding door comprising:
a door frame having a size so as to be accommodated in the gate;
plural magnetic shielding forming members provided on the door frame and disposed to respectively correspond to the magnetic members and made of a magnetic material that forms a magnetic shielding in cooperation with the magnetic members provided in the wall portion, the magnetic members and the magnetic shielding forming members being disposed to be parallel to each other at the door closing position; and
a movable mechanism that moves the respective magnetic shielding forming members at a door closing position, the movable mechanism causing the respective magnetic shielding forming members to be moved between a join position at which the magnetic members and the corresponding magnetic shielding forming members are joined to each other, and a spaced-apart position at which the magnetic members and the corresponding magnetic shielding forming members are spaced apart from each other, wherein:
each of the magnetic shielding forming members provided on the door frame comprises a fixed member made of a magnetic material disposed so as to be accommodated in the gate at the door closing position and formed in a shape extending in a particular direction and a movable member overlapped the fixed member and made of a magnetic material provided so as to move in a longitudinal direction substantially parallel to a plane defined by the fixed member; and
the movable member of each of the magnetic shielding forming members provided on the door frame is configured so as to be able to move between a retract position at which the movable member is accommodated in the gate and a protruding position at which the movable member protrudes outward from the gate at the door closing position and is joined to the corresponding magnetic member, along the longitudinal direction, provided in the wall portion when each of the magnetic shielding forming members is at the join position.

11. The magnetic shielding door according to claim 10, wherein:
the movable member is configured so as to move from the spaced-apart position to the join position in association with a movement from the retract position to the protruding position, while moving from the join position to the spaced-apart position in association with a movement from the protruding position to the retract position.

12. The magnetic shielding door according to claim 11, wherein:
the movable mechanism includes a pin moving in association with a supporting member that supports the fixed member and a guiding groove that guides the pin so that the movable member comes closer to the magnetic member with an increase of relative displacement in the longitudinal direction between the fixed member and the movable member.

13. The magnetic shielding door according to claim 12, wherein:
   each movable member is formed of a pair of movable portions provided so as to be able to move in directions opposite to each other; and
   one of the pair of the movable portions is provided so as to be joined to one of the magnetic members disposed on both sides with the gate in between, and the other movable portion is provided to be joined to the other one of the magnetic members disposed on the both sides with the gate in between.

14. The magnetic shielding door according to claim 13, further comprising:
   a pair of racks disposed so as to sandwich an external gear and to be almost parallel to each other; one of the racks being coupled to one of the pair of the movable portions and the other rack being coupled to the other movable portion.

15. The magnetic shielding door according to claim 14, wherein,
   each of the magnetic shielding forming members is disposed in a posture extending in a horizontal direction, and further comprising;
   a coupling fitting coupled to the rack and capable of moving horizontally together with the rack; and
   a rotary member that is supported on the coupling fitting in a rotatable manner and allows the pin to move in an up-and-down direction.

16. The magnetic shielding door according to claim 15, further comprising:
   a linear guide provided to extend in the horizontal direction and provided with a slider that is allowed to slide thereon; and
   a bracket that couples the coupling fitting and the slider to each other.

17. The magnetic shielding door according to claim 15, further comprising:
   a stopper that prevents a bottom surface of the movable member from coming down below a top surface of the corresponding magnetic member.

18. The magnetic shielding door according to claim 10, further comprising:
   holding members that hold the magnetic shielding forming members for the respective magnetic shielding forming members; each holding member being configured so as to hold the fixed member while allowing the movable member to move.

19. The magnetic shielding door according to claim 18, further comprising:
   a coupling member that moves each of the holding members between the join position and the spaced-apart position without changing a positional relationship with respect to one another.

20. The magnetic shielding door according to claim 10, further comprising:
   a locking member that prevents the movable member from coming into contact with a fixed body on the circumference of the gate, the locking member being capable of moving to a position at which the locking member is able to come into contact with the fixed body in association with a movement of the movable member to the protruding position, and to evacuate from the fixed body in association with a movement of the movable member to the retract position.

* * * * *